(12) United States Patent
Shero et al.

(10) Patent No.: US 9,111,749 B2
(45) Date of Patent: *Aug. 18, 2015

(54) SILANE OR BORANE TREATMENT OF METAL THIN FILMS

(71) Applicant: ASM IP HOLDING B.V., Almere (NL)

(72) Inventors: Eric Shero, Phoenix, AZ (US); Suvi Haukka, Helsinki (FI)

(73) Assignee: ASM IP HOLDINGS B.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/300,986

(22) Filed: Jun. 10, 2014

(65) Prior Publication Data

US 2014/0295673 A1 Oct. 2, 2014

Related U.S. Application Data

(63) Continuation of application No. 13/830,322, filed on Mar. 14, 2013, now Pat. No. 8,846,550.

(51) Int. Cl.
*H01L 21/31* (2006.01)
*H01L 21/469* (2006.01)
(Continued)

(52) U.S. Cl.
CPC .... *H01L 21/02211* (2013.01); *H01L 21/02271* (2013.01); *H01L 21/28088* (2013.01); *H01L 21/3105* (2013.01); *H01L 21/321* (2013.01); *H01L 29/4966* (2013.01); *H01L 29/517* (2013.01); *Y10S 438/932* (2013.01)

(58) Field of Classification Search
CPC .................. H01L 21/02389; H01L 21/02186; H01L 21/28088; H01L 21/28556; H01L 21/31641; H01L 21/31645; H01L 27/1104; H01L 35/22; H01L 51/008
USPC ......... 438/786, 197, 680, 932, 474, 479, 683, 438/685, 688, 740, 753; 257/E21.006, 257/E21.077, E21.17, E21.267, E21.278, 257/E21.293, E21.435
See application file for complete search history.

(56) References Cited

U.S. PATENT DOCUMENTS 3,708,728 A 1/1973 Sterling et al.
3,925,337 A 12/1975 Heiberger
(Continued)

FOREIGN PATENT DOCUMENTS

EP 0387403 9/1990
EP 0394054 10/1990
(Continued)

OTHER PUBLICATIONS

1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous, Sep. 19, 2005.
(Continued)

*Primary Examiner* — David Nhu
(74) *Attorney, Agent, or Firm* — Knobbe Martens Olson & Bear LLP

(57) ABSTRACT

The negative effect of oxygen on some metal films can be reduced or prevented by contacting the films with a treatment agent comprising silane or borane. In some embodiments, one or more films in an NMOS gate stack are contacted with a treatment agent comprising silane or borane during or after deposition.

27 Claims, 4 Drawing Sheets

(51) Int. Cl.
  *H01L 21/02* (2006.01)
  *H01L 21/28* (2006.01)
  *H01L 21/3105* (2006.01)
  *H01L 21/321* (2006.01)
  *H01L 29/49* (2006.01)
  *H01L 29/51* (2006.01)

(56) References Cited

U.S. PATENT DOCUMENTS

| | | |
|---|---|---|
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntoloa et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,405,158 B2 | 7/2008 | Lai et al. |
| 7,416,981 B2 | 8/2008 | Lee et al. |
| 7,794,798 B2 | 9/2010 | Hautala |
| 8,846,550 B1 * | 9/2014 | Shero et al. .................. 438/786 |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1 | 11/2003 | Derderian et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |

(56) References Cited

U.S. PATENT DOCUMENTS

| | | | |
|---|---|---|---|
| 2009/0081868 A1 | 3/2009 | Shah et al. | |
| 2009/0315093 A1 | 12/2009 | Li et al. | |
| 2013/0078454 A1 | 3/2013 | Thompson et al. | |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| JP | 58-033841 | 2/1983 |
| JP | 06-037041 | 2/1994 |
| JP | 06-069157 | 3/1994 |
| JP | 07-230957 | 8/1995 |
| JP | 08-264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2007/041089 | 4/2007 |
| WO | WO 2008/137399 | 11/2008 |

OTHER PUBLICATIONS

Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E = CH, N)," J. Mater. Chem. 13:365-369 (2003).
Elers et al., NbCl5 as a precursor in atomic layer epitaxy, Applied Surface Science, Jul. 9, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of $ZnS_{1-x}Se_x$ thin films by substituting surface sulfur with elemental selenium," Appl. Surface Sci., 112:154-158 (1997).
International Search Report and Written Opinion dated Apr. 7, 2008, Application No. PCT/US2007/082131.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., Atomic-layer-depositied WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," ieee International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS 46th International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Kukli et al., Properties of $(Nb_{1-x}Ta_x)_2O_5$ Solid Solutions and $(Nb_{1-x}Ta_x)_2O_5$-$ZrO_2$ Nanolaminates Growth by Atomic Layer Epitaxy, NanoStructured Materials, 1997, vol. 8, pp. 785-793.
Lai et al., Precursors for Organometallic Chemical Vapor Deposition of Tungsten Carbide Films, Chem. Mater., 1995, vol. 7, pp. 2284-2292.
Lakomaa et al., "Surface reactions in $Al_2O_3$ growth from trimethylaluminum and water by atomic layer epitaxy," Applied Surface Science, vol. 107, pp. 107-115 (1996).
Leskelä et al., ALD precursor chemistry: Evolution and future challenges, Jour. Phys. IV France 9, 1999, pp. 837-852.
Ludviksson et al., Low-Temperature Thermal CVD of Ti-Al Metal Films Using a Strong Reducing Agent, Chem. Vap. Deposition, 1998, vol. 4, Issue 4, pp. 129-132.

(56) References Cited

OTHER PUBLICATIONS

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Martensson et al., Atomic Layer Epitaxy of Copper and Tantalum, Chemical Vapor Deposition, 1997, vol. 3, Issue 1, pp. 45-50.

Martensson et al., Cu(THD)$_2$ As Copper Source in Atomic Layer Epitaxy, Electrochemical Society Proceedings, vol. 97-25, (1997) pp. 1529-1536.

Matsunami et al., Hetero-interface control and atomic layer epitaxy of SiC, Applied Surface Science, 1997, vol. 112, pp. 171-175.

Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.

Min et al., Atomic Layer Deposition of TiN Thin Films by Sequential Introduction of Ti Precursor and HN$_3$, Mat. Res. Soc. Symp. Proc., 1998, vol. 514, pp. 337-342.

Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

Polyakov et al., Growth of GaBN Ternary Soloutions by Organometallic Vapor Phase Epitaxy, Journal of Electronic Materials, 1997, vol. 26, Issue 3, pp. 237-242.

Ritala et al., Atomic layer epitaxy growth of TiN thin films, J. Electrochem. Soc., 1995, vol. 142, Issue 8, pp. 2731-2737.

Ritala et al., Atomic Layer Epitaxy Growth of TiN Thin Films from TiI$_4$ and NH$_3$, J. Electrochem. Soc., Aug. 1998, vol. 145, Issue 8, pp. 2914-2920.

Ritala et al., "Controlled Growth of TaN, Ta3N5, and TaOxNy Thin Films by Atomic Layer Deposition", Chem. Mater., 1999, vol. 11, pp. 1712-1718.

Ritala et al., Effects of intermediate zinc pulses on properties of TiN and NbN films deposited by atomic layer epitaxy, Appl. Surf. Sci., 1997, vol. 120, pp. 199-212.

Ritala et al., Perfectly conformal TiN and Al2O3 films deposited by atomic layer deposition, Chem. Vapor Deposition, 1999, vol. 5, pp. 7-9.

Ritala et al., Surface roughness reduction in atomic layer epitaxy grown of titanium dioxide thin films, Thin Solid Films, vol. 249, pp. 155-162 (1994).

Sadayuki et al., Sub-atomic layer growth of SiC at low temperatures, Japanese Journal of Applied Physics, 1995, vol. 34, Issue 11, pp. 6166-6170.

Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.

Sherman et al., Plasma enhanced atomic layer deposition of Ta for diffusion barrier applications, AVS 46$^{th}$ International Symposium, Oct. 26, 1999, Seattle, WA, US.

Tulhoff et al., Ullmann's Encyclopedia of Industrial Chemistry, 5$^{th}$, Completely Revised Edition, 1986, vol. A5, pp. 61-77.

Suntola, "Atomic Layer Epitaxy," Handbook of Crystal Growth 3, Ch. 14, pp. 601-663 (1994).

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wong et al., Barriers for copper interconnections, Solid State Technology, 1999, pp. 1-7.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.

U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.

U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.

U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.

U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.

U.S. Appl. No. 11/286,203, filed Nov. 22, 2005 including prosecution history, including but not limited to Office Action dated Sep. 28, 2007.

\* cited by examiner

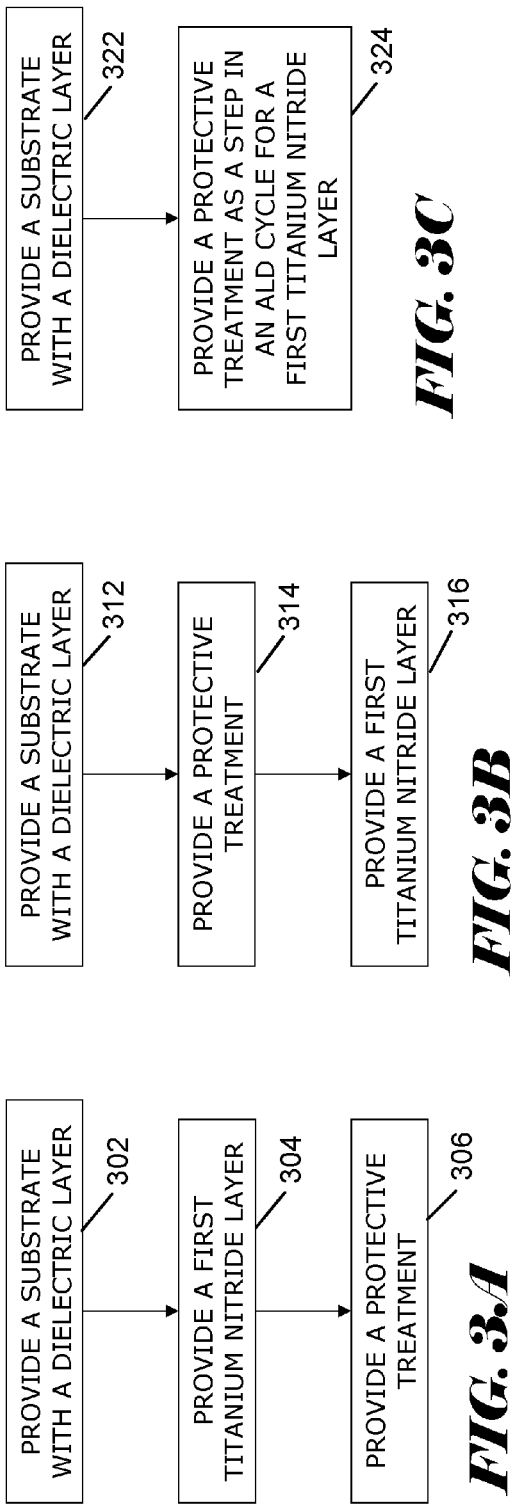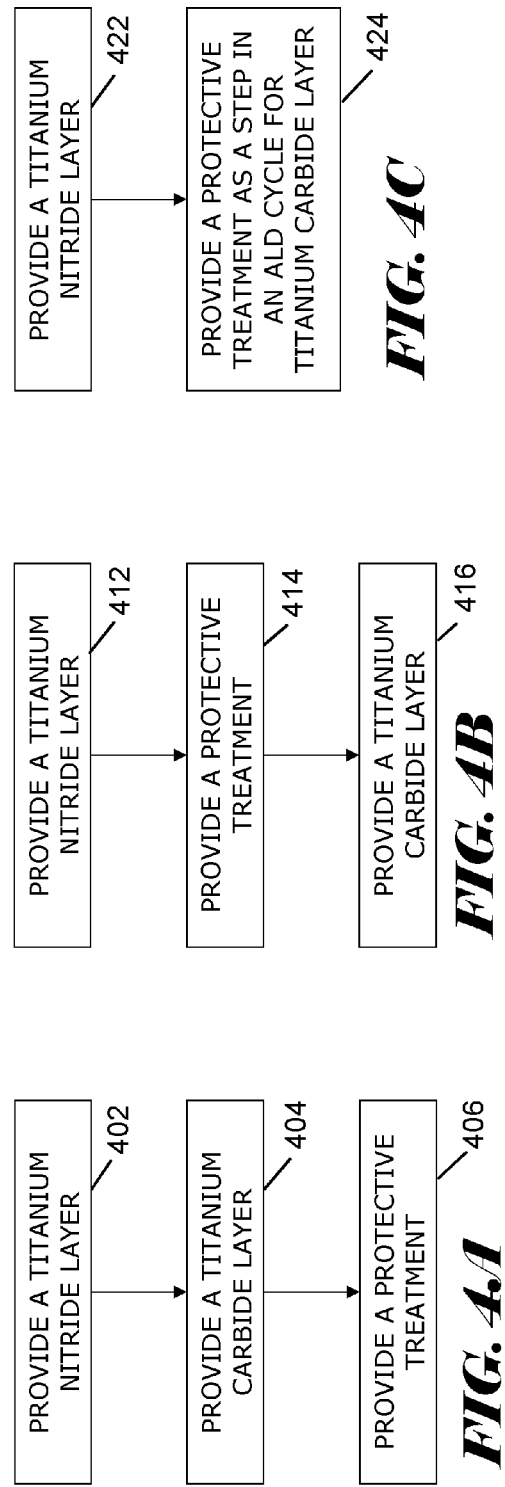

SILANE OR BORANE TREATMENT OF METAL THIN FILMS

BACKGROUND OF THE INVENTION

1. Field of the Invention

The present application relates generally to processes for providing a protective treatment to metal thin films. In some embodiments, thin films used in metal gate and metal electrode applications in metal oxide semiconductor field effect transistors (MOSFETs), such as n-channel MOSFETs (NMOS) are treated either during or after deposition in order to prevent or reduce the effects of oxidation.

2. Description of the Related Art

Oxidation of a metal thin film can easily occur during many steps in processing, such as by exposure to atmospheric water or oxygen. In a multi-step fabrication process oxidation may occur between the deposition of each thin film, such as when transferring a wafer or substrate between deposition modules. Oxidation poses a problem in that it can affect the workfunction of a given thin film or an entire stack. And oxidation in one thin film may lead to oxidation of the interface between that film and a second film or even oxidation of the second film itself if the oxygen is able to diffuse through the first film to the second film.

For example, in a typical fabrication process of a MOSFET, oxidation of the etch-stop layer can easily occur after formation of a PMOS stack and before formation of an NMOS stack. Oxidation of the etch-stop layer can affect the workfunction of the subsequently formed NMOS stack, as it may lead to a shift in the workfunction, for example, from n-type to p-type. Other layers deposited during formation of a gate stack can also be exposed to oxygen, for example between deposition of each of the various thin films.

Referring to FIG. 1, a typical NMOS stack 100 is illustrated. The stack 100 includes a dielectric layer 102, a first metal nitride layer 104, a metal carbide layer 106—in which the interface 108 between the first metal nitride layer 104 and the metal carbide layer 106 includes oxidized portions represented by the presence of oxygen ("O") atoms—a second metal nitride layer 110, and a metal layer 112. The presence of oxygen at the interface 108 between the first metal nitride layer 104 and the metal carbide layer 106 can undesirably shift the workfunction of the stack 100 from n-type to p-type.

Oxidation of the various layers can occur in a variety of ways during formation of the stack; however, it is common for the first metal nitride layer 104 to have already been oxidized prior to the deposition of the metal carbide layer 106. Even if the metal carbide layer 106 is able to be deposited without the presence of oxygen so as to achieve a relatively pure layer of a metal carbide, oxygen present in the first metal nitride layer 104 is capable of diffusing up into the metal carbide layer 106. Oxygen in the metal carbide layer 106 and particularly at the interface 108 can undesirably shift the work function of the overall stack 100.

SUMMARY OF THE INVENTION

According to some embodiments of the present disclosure, methods for forming a gate stack include providing a substrate having a dielectric material and a first metal-containing thin film over the dielectric material, contacting the first thin film with a silane or borane compound, and depositing a second metal-containing thin film over the first metal-containing thin film. In some embodiments, the first thin film comprises a metal selected from Ti, Ta, Hf, V, Nb, and Zr. In some embodiments, the first metal-containing thin film is an etch stop layer or barrier layer and the second metal-containing thin film is a workfunction setting layer. The first metal-containing thin film in some embodiments is a TiN, TiAlN, TaN or TiAlCN thin film.

According to some embodiments, the second metal containing thin film comprises an n-type metal. And in some embodiments, the n-type metal (or n-metal) film comprises a metal carbide, such as TaC, TiC, HfC, TaAlC, TiAlSiC, or SiAlSiC. In some embodiments, the n-type metal is TiAl, TiAlB, TaAlB, TiAlSiB, TaAl, or HfAlSiB. The second metal-containing thin film in some embodiments is a titanium carbide film. In some embodiments the metal in the first metal-containing thin film is different from the metal in the second metal-containing thin film.

According to some embodiments of a method for forming a gate stack, contacting the first metal-containing thin film with a silane or borane compound comprises exposing the first metal-containing thin film to the silane or borane compound for a duration of between about 1 second and about 2 minutes. Some methods further include contacting the second metal-containing thin film with a silane or borane compound. In some methods, depositing the second metal-containing thin film comprises an atomic layer deposition process comprising multiple deposition cycles.

According to some embodiments, the substrate is exposed to a silane or borane compound in each deposition cycle. Some methods further include depositing a third metal-containing thin film over the second metal-containing thin film. The third metal-containing thin film may comprise a different metal from the second-metal containing thing film. In some methods, the substrate is contacted with a silane or borane compound during or after depositing the second metal-containing thin film and prior to depositing the third metal-containing thin film. And in some methods, the substrate is contacted with a silane or borane compound during or after deposition of the third metal-containing thin film. Some methods further include depositing a metal over the third metal-containing thin film. The metal in some embodiments is tungsten.

According to some embodiments, the silane or borane is selected from the group consisting of monosilane, disilane, trisilane, borane, diborane, and triborane. And in some embodiments, the silane or borane is trisilane. According to some methods, the first and second metal-containing thin films are deposited in situ.

Some embodiments of methods for forming an NMOS stack according to the present disclosure include, sequentially, providing a substrate comprising a previously deposited dielectric material and an etch stop layer, contacting the etch stop layer with a silane or borane compound; and depositing a metal-containing layer over the first etch stop layer.

In some methods, the etch stop layer is a titanium nitride layer and the metal-containing layer comprises an n-type metal. The metal-containing layer in some methods comprises TiAl, TaC, HfC, TaAlC, TiAlSiC, TiAl B, TaAlB, TiAlSiB, TaAl, TiAlSiC TaAlSiB, or HfAlSiB. Some methods also include contacting the metal-containing layer with a silane or borane compound. The metal-containing layer in some methods is deposited by an atomic layer deposition process comprising multiple deposition cycles, and the substrate is contacted with a silane or borane compound during at least one of the deposition cycles. In some embodiments, the silane or borane is selected from the group consisting of monosilane, disilane, trisilane, borane, diborane, and triborane. And contacting the etch stop layer with a silane or borane compound in some methods does not increase the thickness first metal nitride layer.

BRIEF DESCRIPTION OF THE DRAWINGS

The invention will be better understood from the Detailed Description of the Preferred Embodiments and from the appended drawings, which are meant to illustrate and not to limit the invention, and wherein:

FIGS. 3A-C are flow charts generally illustrating protective treatment of a dielectric layer or titanium nitride layer during a process of forming a thin film stack, in accordance with some embodiments.

FIGS. 4A-C are flow charts generally illustrating protective treatment of a titanium nitride or titanium carbide layer during a process of forming a thing film stack, in accordance with some embodiments.

DETAILED DESCRIPTION OF THE PREFERRED EMBODIMENT

Figure 1:
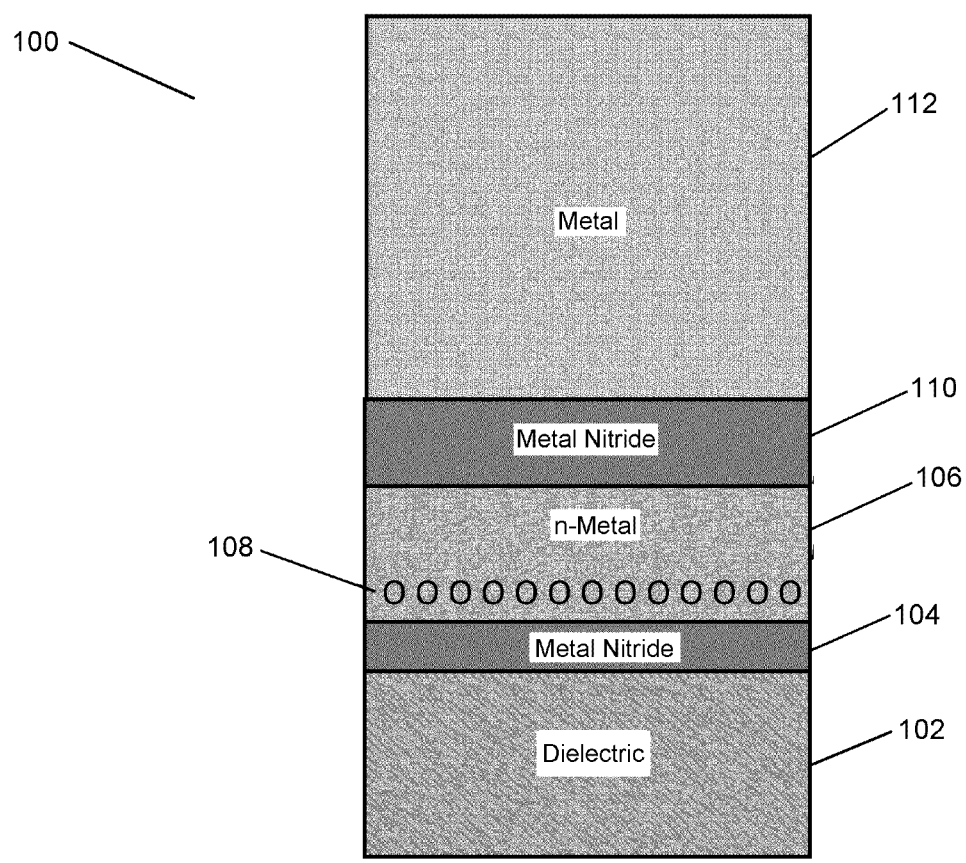
FIG. 1 is a schematic cross-sectional side view of a gate stack containing an oxidized portion.

The present disclosure provides methods for reducing or preventing undesirable effects of oxidation in one or more thin films comprising metal. The thin films can be deposited using known vapor deposition processes, such as atomic layer deposition (ALD) or chemical vapor deposition (CVD) processes. In some embodiments the methods for reducing oxidation can comprise an oxygen barrier material or a preventative treatment applied to a deposited thin film. In some embodiments however, a protective treatment may be provided as a part of an ALD or CVD method used to form the thin film. A protective treatment may comprise exposing the film to be treated to a silane or a borane compound. The treatment may reduce or substantially prevent oxidation of the thin film and the possible buildup of oxygen at the interface of the thin film and an overlying layer.

Oxidation resistance is important in many contexts. For example, in a gate stack even a minor amount of oxygen in the stack could change the stack's electrical properties, namely eWF, making it unsuitable for its intended purpose. Moreover, processing, including deposition of films and film stacks, without exposure to air or ambient moisture can be costly, difficult, and/or too complex. The application of a preventative treatment during or after deposition of one film in a manufacturing process may not only reduce or prevent oxidation of that film but also of overlying films during subsequent processing steps. Thus, using a protective treatment can simplify processing while also controlling costs.

In addition, although described as preventative, the treatment may also reduce the deleterious effects of oxygen that is already present in a film, such as from previous processing steps or transport. The material used in the treatment may remove or isolate oxygen that may be present in a thin film or on the surface of a thin film. In some embodiments, treatment of one thin film may benefit subsequent layers or films in that the treatment may prevent oxygen from migrating up into those layers.

Without being held to any particular theory, the silicon or boron introduced into a metal film during treatment with silane or borane reduces bonds between oxygen and the metal by formation of silicon oxide or boron oxide. The oxygen may be present in the film at the time of treatment, or the film may subsequently be exposed to oxygen. For example, if an oxidized TiN film is treated with silane or borane, the TiON is reduced back to TiN. The presence of Si and/or B in a treated metal film can also act as a barrier to oxidation, such as during subsequent processing steps, by allowing the oxygen to preferentially bond with the Si and/or B, relative to the metal of the metal film.

In some embodiments, a silane or borane treatment can be used to reduce the resistivity of a thin metal film, such as a titanium carbide film.

In some embodiments, a metal thin film is deposited and subsequently receives a protective treatment, which may comprise exposure to a silane or a borane. For example a metal thin film may be formed by a known deposition process, such as by a CVD process and then exposed to a borane or silane, such as trisilane or disilane.

In some embodiments, the protective treatment may be provided during deposition of the metal film, rather than, or in addition to, the treatment being applied after deposition. That is, the treatment may be applied intermittently during deposition. For example, a substrate may be exposed to silane or borane intermittently in an atomic layer deposition process for forming a metal thin film, such as a metal nitride or metal carbide thin film. In some embodiments the substrate is exposed to the silane or borane in each deposition cycle, after a certain number of deposition cycles, or after all the deposition cycles have been completed.

In some embodiments the thin film that is treated comprises one or more metals selected from the group consisting of Ti, Ta, W, In some embodiments the thin film that is treated comprises Ta, Ti, or W, such as a TaN film, a TiC film, or a W film. In some embodiments the thin film that is treated comprises TiAl, TaC, HfC, TaAlC, TaAlB, TaAl, SiC, HfAlSiB, etc. In some embodiments the thin film comprises an n-type metal, such as titanium. In some embodiments the thin film is deposited during integrated circuit processing, such as during formation of a gate stack, as described in more detail below. Although generally described herein with reference to films deposited during fabrication of NMOS transistors, the skilled artisan will recognize that the methods described herein can be used in other contexts where metal-containing films are or could be exposed to oxygen.

In some preferred embodiments, the treatment agent comprises one or more silane or borane, or a mixture of silanes and boranes. The silane or borane may be selected from the following: borane, diborane, triborane, silane, monosilane, disilane, trisilane, or a mixture of two or more of these. The treatment agent may be provided as a brief pulse, such as during one or more ALD cycles, or may be provided for longer periods of time, such as when a previously deposited film is being treated. The length of time can be controlled to achieve the desired amount of silicon or boron in the thin film.

In some embodiments, the pressure within a reaction chamber during a protective treatment is between about 0.1 torr and about 50 torr, though the pressure can be between about 0.5 torr and about 5 torr.

In some embodiments, the temperature within a reaction chamber is between about 350° C. and about 450° C., though it can be between about 380° C. and about 420° C. or, preferably, between about 390° C. and about 420° C.

In some embodiments, the duration of exposure to the treatment agent may be from about 1 second and to about 60 seconds or more. Longer periods, such as at least about 10 seconds, may be desired if treating a thicker film, such as where a completed film has already or previously been deposited prior to a protective treatment. And shorter periods, such as about 1, 2 or 3 seconds, may be desired when incorporating a treatment step into a deposition cycle. In some embodiments, treatment may comprise exposure to the treatment agent for less than 1 second.

Gate Stack Applications

The processes disclosed herein may be applied in a variety of contexts where protecting a layer from oxidation or reducing the effect of oxygen on the properties of an oxidized layer may be beneficial. Although primarily illustrated in the context of the fabrication of NMOS transistors, which may include planar "replacement gate" devices as well as multiple gate transistors, such as FinFETs, the skilled artisan will be aware of other relevant contexts in which the disclosed methods could be utilized, such as metal electrodes for memory structures where an n-type metal is needed.

In the context of the present disclosure, a protective treatment refers to exposing a thin film comprising metal on a substrate to a treatment agent comprising silane or borane. The treatment agent may react with oxygen that may be present on or in the thin film or with oxygen upon subsequent exposure of the thin film to oxygen or oxidizing agents. In some cases, at least some oxygen is bound to metal atoms in the thin film, and with exposure to the treatment agent comprising silane or borane the metal oxygen bonds are reduced by preferential formation of silicon oxide or boron oxide. The silane or borane agent may also bind oxygen that is not bound to metal, such as oxygen that may be present in the form of contaminants such as water, hydroxyl groups, etc.

As mentioned above, the treatment agent comprises one or more silanes and/or boranes, such as monosilane, disilane, trisilane, borane, diborane, and triborane.

The treatment agent may be applied in vapor or liquid form. However, the treatment is typically carried out by providing a vapor phase pulse of the treatment agent The length of time that the treatment agent is applied may vary, for example depending on the thickness of the film being treated and the amount of oxidation or the anticipated exposure to oxidizing agents. In some embodiments the treatment agent is contacted with the film for a period of about 1 second to about 10 minutes, from about 2 second to about 5 minutes, from about 10 seconds to about 2 minutes or from about 20 seconds to about 60 seconds. However, shorter or longer exposures can be utilized. For example, in some embodiments the treatment agent may be applied as a relatively short pulse, such as less than about 1 second. In some embodiments a partially or completely deposited film is soaked in the treatment agent, such as for 1 second or more, 10 seconds or more, 20 seconds or more, 30 seconds or more, or 60 seconds or more. In some embodiments the soak may be for at least one minute, two minutes, five minutes, ten minutes or more. Specific treatment times can be determined by the skilled artisan depending on the particular circumstances such as the type of film, thickness of the film, amount of existing oxidation of the film and the type of exposure to oxidizing agents that is anticipated.

In some embodiments the protective treatment does not add to the thickness of a thin film, such that a thin film (or plurality of thin films) that has received a protective treatment is not appreciably thicker than a thin film that has not received such a treatment.

In some embodiments, a thin film comprising a metal is deposited according to a known process, such an ALD or a CVD process. A protective treatment can then be applied to the thin film after the thin film has been fully deposited. However, in some embodiments, the protective treatment forms a part of the deposition process. For example, where an ALD process is used, the protective treatment may comprise one step of at least one ALD cycle. In some cases, the protective treatment is provided in a certain number of ALD cycles or all of the ALD cycles. For example, the protective treatment may be provided as a separate pulse in every ALD cycle, or provided every 2, 3, 4, 5, 10, 20 or more ALD cycles. For CVD deposition, the CVD deposition process may be interrupted one or more times during deposition to provide the treatment agent. In some embodiments, the protective treatment is applied as the last pulse or exposure in the deposition process.

In some embodiments, the protective treatment is applied to the substrate prior to the deposition of a thin film that is to be protected from oxidation. For example, treatment of an oxidized film on a substrate surface may prevent migration of oxygen from that film to a film that is subsequently deposited over the treated film and that will benefit from being protected from oxidation.

As discussed above, in addition to reducing metal oxide and thus addressing previous exposure to an oxidizing agent, the use of a protective treatment may also protect a metal thin film from being oxidized by subsequent exposure to oxygen. The use of a protective treatment may also at least partially protect one or more films that are deposited over a treated thin film.

Figure 2:
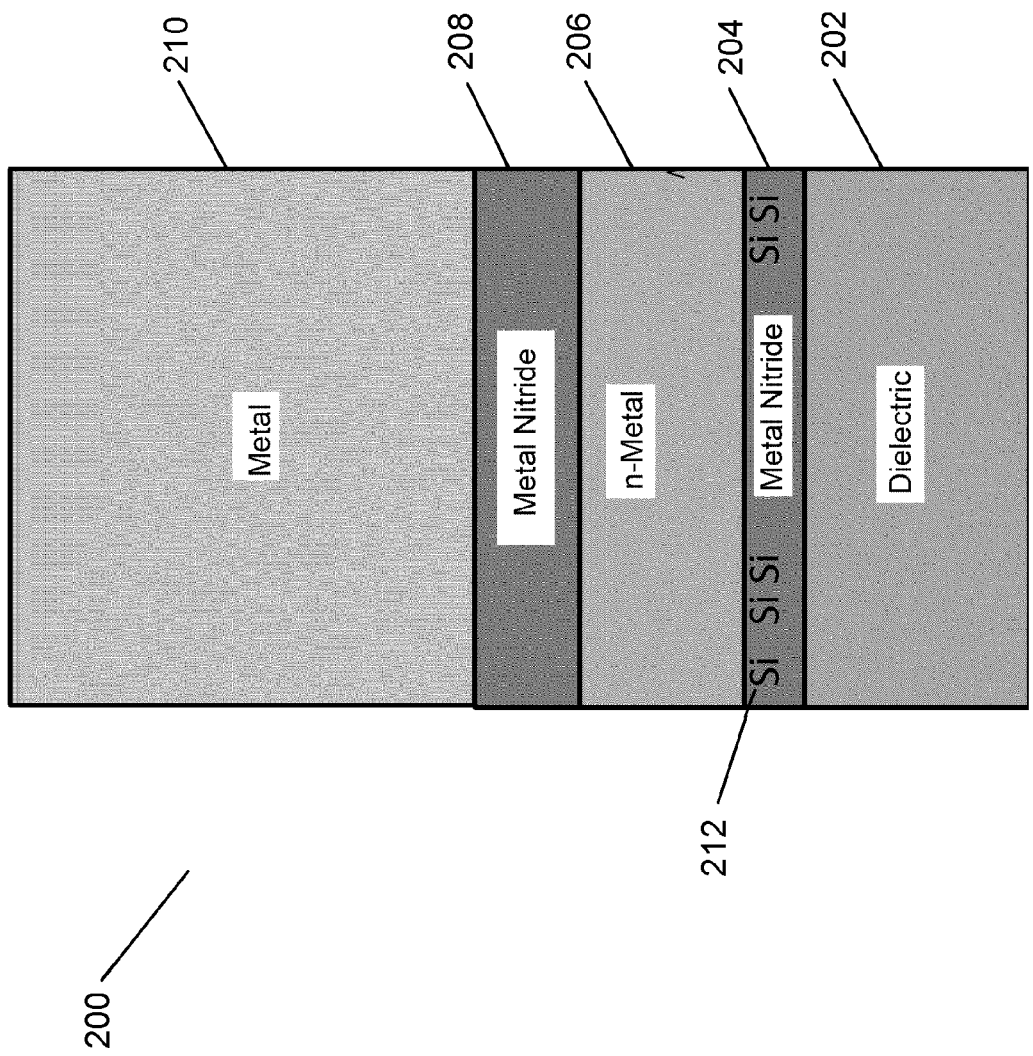
FIG. 2 is a schematic cross-sectional side view of an electrode structure, comprising an NMOS stack that includes a dielectric layer, a first metal nitride layer, a metal carbide layer, a second metal nitride layer, and a metal layer, according to some embodiments of the invention.

Referring to FIG. 2, an exemplary embodiment of an NMOS stack 200 is illustrated. The stack 200 includes a dielectric layer 202, such as hafnium oxide, a first etch stop layer or bottom barrier layer 204, such as a titanium nitride (TiN) layer, a first n-type metal layer, here illustrated as a metal carbide layer 206, such as tantalum carbide (TaC), a second metal nitride layer 208, and a metal layer 210, such as a tungsten (W) layer. The presence of silicon 212 derived from a protective treatment is illustrated as being contained within the first metal nitride layer 204. While the silicon 212 may form a part of or be contained in any one of or more than one of the illustrated layers, FIG. 2 illustrates that the silicon 212 is located more or less at the interface of the first metal nitride layer 204 and the n-type metal layer 206. Without being tied to any particular theory, it is believed that this interface or near-interface region may determine or influence the workfunction of the overall stack 200. Thus, limiting the migration of materials such as oxygen or aluminum—which can occur more easily as the layers become thinner—may help protect the workfunction or another characteristic of the stack 200. Accordingly, in some embodiments, such as the one illustrated here, it may be particularly beneficial to provide a protective treatment as a part of the deposition of the etch stop layer 204 or prior to the deposition of the n-metal layer 206, where the protective treatment may provide silicon 212 (or boron), at least at or near the interface between the etch stop and n-metal films (the first metal nitride layer 204 and the metal carbide layer 206 as illustrated). In some embodiments, a protective treatment is applied to the first etch stop layer 204 once the substrate has been placed in a chamber for depositing the n-metal layer but before deposition of the n-metal layer has begun. Of course, treatment may be utilized to provide Si or B at the interface between any two layers.

In some embodiments, an etch-stop layer (or bottom barrier layer) that receives a protective treatment could comprise TiN, TaN, or other materials known in the art. And materials other than TaC could be used as then n-type metal layer, including other oxygen sensitive n-type metal films, such as TiAl, TiC, HfC, TaAlC, TaAlB, TaAl, SiC, HfAlSiB. Other types of films that would benefit from the treatment will be apparent to the skilled artisan.

The use of a protective treatment can bind up at least some of the oxygen that may be present initially, or upon subsequent exposure, such as during transport from one chamber to another. The use of a protective treatment may also reduce at least some of the previously oxidized portions of a thin film, such as the first metal nitride layer 204. For example, substrates may be received that already contain an etch stop layer (or bottom barrier layer), such as a TiN layer, and that layer can be treated as described herein by exposure to a treatment agent prior to subsequent processing.

The thicknesses of the various layers in the stack 200 may vary, though in some embodiments, such as the one illustrated in FIG. 2, the first metal nitride layer 204 may be from about 5 Å to about 20 Å thick, for example about 15 Å thick, and the second metal nitride layer may be about 30 Å to about 50 Å thick. The use of a protective treatment as presently disclosed can have particular utility where the thicknesses of the various layers in a stack, such as stack 200, are reduced to achieve smaller electronic devices and circuitry.

The protective treatments disclosed herein could be applied to any one or more of the layers 202, 204, 206, 208, or 210 before, during, or after the deposition of each thin film. In some embodiments, it is preferable to treat one or both of layers 204 and 206. In some embodiments, it may be preferable to treat one or more of layers 204, 206, and 208. The use of a protective treatment before or during the formation of the NMOS workfunction setting layer (the n-metal layer 206 as illustrated) has been mentioned; however a treatment agent could also or alternatively be applied before or during the deposition of the first etch stop layer (the first metal nitride layer 204). In some embodiments, the use of a protective treatment on the first metal nitride layer 204 may eliminate or reduce the need for such a treatment of any subsequent layers or at least the NMOS workfunction setting layer 206. Similarly, the use of a protective treatment before, during, or after the formation of the n-metal layer 206 may eliminate or reduce the need for a similar treatment to subsequent layers, particularly if a treatment applied to the n-metal layer 206 preserves the work function of the overall stack 200 irrespective of moderate oxidation of the subsequent layers 208 or 210.

However, in some embodiments, it may be beneficial to treat the second metal nitride layer 208 and/or the metal layer 210. As with the lower layers, a protective treatment may reduce oxidized portions of those layers, scavenge oxygen contaminates, and/or prevent subsequent oxidation when exposed to contaminates or the atmosphere.

Irrespective of the layer being discussed, the same methods for applying the protective treatment can be used. In some embodiments the treatment agent is provided as a pulse as a part of a deposition cycle. In some embodiments a deposited film, or portion of a deposited film is soaked in the treatment agent. For example, a protective treatment could be incorporated into an ALD process for forming any one of the layers 204, 206, 208, or 210. And the treatment agent could be provided in every ALD cycle or just in some cycles. With a CVD process, the treatment could be incorporated during the deposition process as other precursors are being exposed to the substrate or could be provided after deposition of the film has been completed and all the precursors have reacted with the substrate and excess reactants have been purged from the reaction space. In some embodiments CVD may be used to deposit film to a first thickness, CVD can be stopped and the reaction chamber purged, that thickness can be exposed to a treatment agent, and CVD can be continued to add additional thickness to the film. This can be repeated as many times as desired to obtain a film with the desired thickness. Again, a final treatment can be applied after the final deposition.

With reference again to FIG. 2, in some embodiments a first metal nitride layer 204 is deposited over the dielectric layer 202, which may comprise a dielectric material such as hafnium oxide. A protective treatment may be applied before, during, and/or after the deposition of the first metal nitride layer 204. In some embodiments, it is desirable to apply a protective treatment to a completed first etch stop layer, such as a TiN layer, prior to the deposition of the NMOS workfunction setting layer, such as then-metal layer 206, even if a protective treatment was used in the deposition of the first etch stop layer. For example, if some time has passed from the time the first metal nitride layer 204 was deposited and the time when the n-metal layer 206 is deposited. Such a delay may increase the chances that the first metal nitride layer will be exposed to water, air, etc.

FIG. 3A illustrates one possible process where a substrate having a dielectric material is provided at step 302, and a metal nitride layer, such as a titanium nitride etch stop layer, is deposited over the dielectric layer at step 304. A protective treatment is then applied to the completed titanium nitride etch stop layer at step 306. The protective treatment applied at step 306 may be applied as a soak, and may reduce TiON and/or bind to free oxygen in the TiN layer, particularly near the surface. The duration of step 306 may be, for example, from about 30 seconds to about 4 minutes. The duration may depend on the thickness of the titanium nitride layer and may be adjusted by the skilled artisan based on the particular circumstances. In some embodiments, the duration can be shortened if step 306 is performed at a higher pressure and/or a higher temperature.

FIG. 3B illustrates a process where a substrate having a dielectric material is provided at step 312, and a protective treatment is applied to the dielectric layer at step 314. A titanium nitride is then deposited by a known method at step 316. In this process, free oxygen that may have been present in or on the dielectric layer may be bound up by the protective treatment so that it is not available to oxidize the titanium deposited in step 316. In some embodiments where the dielectric material receives a protective treatment, the protective treatment may not prevent subsequent oxidation of additional layers, but it may prevent oxygen in the dielectric from diffusing up into the additional layers.

FIG. 3C illustrates one process where a substrate having a dielectric material is provided at step 322, and a titanium nitride film is deposited by an ALD method at step 324 in which a protective treatment is incorporated into one or more of the deposition cycles. The protective treatment may be provided in only one deposition cycle or may comprise a step in a certain number of cycles, such as every other cycle or every third, fourth, fifth, sixth, seventh cycle, etc.

In some embodiments, the deposition of the titanium nitride layer at step 324 may comprise an ALD process having the following steps:

1. providing a titanium precursor, such as a titanium halide, to the reaction space;
2. substantially purging and/or evacuating excess titanium precursor and reaction byproducts;
3. providing a nitrogen-contributing reactant to the reaction space, such as $NH_3$, hydrazine, or radicals/ions of N and H (such as in a PEALD process);
4. substantially purging and/or evacuating excess nitrogen-contributing reactant and reaction byproducts; and
5. providing a protective treatment agent comprising a silane or borane, to the reaction space.

Step 5 can be included in each ALD cycle or only some of the ALD cycles. Thus, steps 1-4 can be repeated several times before step 5 is introduced. Step 5 may also be used prior to any ALD cycle or only as the first step in the first ALD cycle.

Again referring to FIG. 2, the n-metal carbide layer 206 can be deposited over the first metal nitride layer 204. A protective treatment may be applied before, during, and/or after the deposition of the n-metal layer 206. FIG. 4A illustrates one possible process where a titanium nitride layer is provided at step 402, and an n-type metal layer, such as a titanium carbide layer, is deposited over the titanium nitride layer at step 404. A protective treatment is then applied to the completed titanium carbide layer at step 406. In some embodiments, application of a protective treatment during or before the deposition of the work function setting n-metal layer 206 may help minimize the presence of oxygen in the film while the n-metal layer 206 awaits the second metal nitride layer 208 in a clustered or declustered process. The protective treatment applied at step 406 may comprise soaking the deposited titanium carbide layer in a treatment agent comprising silane or borane. The protective treatment may reduce or bind to oxygen contaminates in the TiC film.

FIG. 4B illustrates one process where a titanium nitride layer is provided at step 412, and a protective treatment is applied to the titanium nitride layer at step 414. A titanium carbide is then deposited by a known method at step 416. In this process, free oxygen that may have been present in or on the titanium nitride layer may be bound up by the protective treatment agent so as to prevent or reduce oxidation of the titanium carbide deposited in step 416.

Other materials may also benefit from the application of a protective treatment according to the present disclosure. All NMOS workfunction layers, such as pure metals like Al and Ti, or transition metal nitrides, carbides, borides, silicides, etc. may suffer from oxygen incorporation making them more p-type. Accordingly, a protective treatment could be applied to films comprising any of such materials.

FIG. 4C illustrates one process where a titanium nitride is provided at step 422, and a titanium carbide is deposited by an ALD method at step 424 in which a protective treatment is incorporated into one or more of the deposition cycles. For example, the protective treatment may comprise a step in only one cycle or may comprise a step in a certain number of cycles, such as every other cycle or every third, fourth, fifth, sixth, seventh cycle, etc.

In some embodiments, the deposition of the titanium carbide layer at step 424 may comprise an ALD process having the following steps:
1. providing a titanium precursor, such as a titanium halide (or other transition metal halides), to the reaction space;
2. substantially purging and/or evacuating excess titanium precursor and reaction byproducts;
3. providing a carbon-contributing reactant to the reaction space, such as compounds containing metal-carbon bonds including metalalkyl compounds (e.g., TTBA and TMA);
4. substantially purging and/or evacuating excess carbon-contributing reactant and reaction byproducts; and
5. providing a protective treatment agent comprising a silane or borane, to the reaction space.

Step 5 can be included in each ALD cycle or only in some of the ALD cycles. Thus in some embodiments steps 1-4 can be repeated several times before step 5 is introduced. Step 5 may also be used prior to any ALD cycle or only as the first step in the first ALD cycle. Application of a protective treatment prior to any ALD cycle for depositing the n-metal layer 206 may be desirable where the first metal nitride layer 204 has already been oxidized, such as where the first metal nitride layer has served as an etch-stop layer in a prior process. In such cases, it may be desirable to apply the protective treatment as a soak of a treatment agent comprising silane or borane prior to depositing the n-metal layer 206. In some embodiments where the TiN layer 204 is treated, protective treatment during or after the deposition of the n-metal layer 206 is not utilized. However, in some embodiments where the first metal nitride layer 204 has been treated, it may still be desirable to apply a protective treatment during or after the deposition of the n-metal carbide layer 206.

In some embodiments, NMOS stacks containing n-metal thin films fabricated using the methods disclosed herein exhibit a leakage ($J_g$) (at $-1$V stress,) of less than about $10^{-2}$ A/cm$^2$, less than about $10^{-3}$ A/cm$^2$, or less than about $3*10^{-4}$ A/cm$^2$.

In some embodiments of the present disclosure, n-metal thin films can be formed in which the equivalent oxide thickness, or EOT, of the thin films can be less than about 1.3 nm, less than about 1.2 nm, preferably less than about 1.1 nm, or less than about 1.05 nm.

In some embodiments of the present disclosure, n-metal films can be formed in which the effective workfunction, or eWF, can be from about 4.0 to about 4.4 eV, from about 4.05 to about 4.35 eV, or from about 4.1 to about 4.25 eV.

In some embodiments, the use of a protective treatment such as a silane (e.g., disilane or trisilane) can reduce the resistivity of an n-metal thin film relative to a TiC film to which a protective treatment is not exposed. In some embodiments, the resistivity is reduced up to or as much as about 30%, up to or as much as about 40%, or up to or as much as about 50%. In some embodiments, such as where a protective treatment is applied as soak after deposition, resistivity reduction may be as much as about 5%, as much as about 10%, or as much as about 20%.

Again referring to FIG. 2, a metal layer 210 may be deposited by any known method. A protective treatment may be applied before, during, and/or after deposition of the metal layer 210. In some embodiments, a second metal nitride layer 208 is provided, and the metal layer 210 is deposited over the metal nitride layer 208. The second metal nitride layer 208 can be deposited over the n-metal layer 206. A protective treatment may be applied before, during, and/or after the deposition of the second metal nitride layer 208, similar to the first metal nitride layer 212. In this process, free oxygen that may have been present in or on the second metal nitride layer 208 may be bound up by the protective treatment so as to not oxidize the subsequently deposited tungsten. Reducing the amount of free oxygen in the second metal nitride layer 208 may have the added benefit of diminishing the amount of oxygen that could diffuse down into the stack 200 during subsequent processes, such as downstream thermal processing, diffusion that could actually reach the workfunction layer (i.e., the n-metal layer 206 or another suitable layer such as TaC).

A protective treatment may be applied to the completed metal layer 210. The protective treatment may be applied as a soak to the deposited metal film. In some embodiments, a metal layer is deposited by an ALD method in which a protective treatment is incorporated into one or more of the deposition cycles. For example, the protective treatment may comprise a step in only one deposition cycle or may comprise a step in a certain number of cycles, such as every fifth, tenth, twentieth cycle, etc.

Again, while illustrated in the context of treating thin films in an NMOS stack, other metal-containing films can be treated as well. The exact composition of metal thin films produced and/or treated using the methods and materials disclosed herein may vary. For example, titanium carbide films fabricated according to the present disclosure may contain a number of differing elemental components including, but not limited to titanium, aluminum, carbon, silicon and/or boron depending in part on the type of protective treatment used.

In some embodiments, the atomic percentage of silane or borane present in a film after treatment could be greater than about 10%, greater than about 25%, or greater than about 35%. In embodiments where the protective treatment is applied as soak, the silane or borane may be very concentrated at those surfaces that were treated, with the concentration dropping off rapidly below those surfaces. In embodiments where the protective treatment is applied as a part of a deposition process, such as in an ALD process, the silane or borane concentration may be from about 5% to about 50%.

Deposition Methods

As discussed above, in addition to the treatment of deposited films, methods presented herein allow treatment during deposition of conformal metal thin films on substrate surfaces.

According to some embodiments, an ALD or quasi-ALD process is used in which a material, such as silicon or boron, is incorporated into a metal thin film and protects the film from oxidation. In some embodiments, the protective treatment is incorporated into one or more cycles of the deposition process. In some embodiments, the protective treatment is applied to a metal thin film after all the deposition cycles have been completed. In some embodiments, the protective treatment is applied prior to a deposition process in order to prepare an underlying surface or as the first step in a deposition process.

According to some embodiments, an ALD or quasi-ALD process is used to form a metal film. For example, one or more films in an NMOS stack can be formed. An exemplary NMOS stack may comprise a dielectric layer, such as a hafnium oxide ($HfO_2$) layer, a thin layer of a first metal-containing film, such as a metal nitride, for example titanium nitride (TiN), over the dielectric, a second metal-containing film, such as a carbide, for example titanium carbide (TiC), over the first metal-containing film, a third metal-containing film, such as a metal nitride, for example TiN, over the second metal-containing film, and a layer of metal, such as tungsten, over the third metal-containing film. In some embodiments, one or more additional elements may be present in one or more of these layers. For example, one or more layers may further comprise silicon or boron, such as following treatment.

In some embodiments an NMOS stack comprises a dielectric layer, a first metal nitride layer over the dielectric layer, a metal carbide layer over the first metal nitride layer, a second metal nitride layer over the metal carbide layer, and a metal layer over the second metal nitride layer. In some embodiments each of the overlying layers is deposited directly on and contacting the underlying layer.

In some embodiments an NMOS stack comprises a dielectric layer, such as $HfO_2$, a first titanium nitride layer over the dielectric, a titanium carbide layer over the first titanium nitride layer, a second titanium nitride layer over the titanium carbide layer, and a tungsten layer over the second titanium nitride layer.

A protective treatment may be used in the deposition process of one or more of these respective thin films of the NMOS stack. In some embodiments, a protective treatment is used prior to the deposition of one or more thin films. In some embodiments, a protective treatment is used after the deposition of one or more thin films. Of course other metal films may be deposited by ALD or quasi-ALD processes comprising one or more treatment steps.

In some embodiments, the protective treatment does not increase the thickness of the thin film. This is particularly beneficial as thinner and thinner films become more and more desirable and necessary, as one problem with thinner films is that oxygen can more easily diffuse through and oxidize them as compared to thicker films in which only the upper portions would be oxidized. It will be readily appreciated by those of skill in the art, that protective treatments can provide benefits to many different functional thin films.

According to some embodiments of the present disclosure, the use of a protective treatment in the fabrication of multiple thin films, such as to form an NMOS stack, can result in a lower resistivity of the films—as much as about 30% less—compared to films fabricated without the use of a protective treatment. In some embodiments, the presence of silicon or boron—a component of the protective treatment—may serve to reduce the overall resistivity of the film or films.

In some embodiments, the use a protective treatment may eliminate or reduce the need to utilize an in situ or clustered fabrication process. In some embodiments, the use of a protective treatment may allow for fabrication processes performed at lower vacuum than ordinary processes. However, in some embodiments, high vacuum, clustered, and/or in situ processes are desirably combined with a protective treatment.

In some embodiments, some of the variables that can be controlled to achieve a desirable result include, but are not limited to, pressure, temperature, duration, and quantity of the protective treatment used. In some embodiments, the pressure within a reaction chamber is between about 0.1 torr and about 10 torr. In some embodiments, the pressure is between about 0.5 torr and about 5 torr. In some embodiments, the temperature within a reaction chamber is between about 350° C. and about 450° C. In some embodiments, the temperature is between about 380° C. and about 420° C. and, preferably, between about 390° C. and about 420° C.

According to some embodiments, the duration of a treatment, cycle step, pulse, or soak using a protective treatment is between about 1 second and about 60 seconds. Longer periods, such as at least about 10 seconds, may be desired if treating a thicker film, such as where a completed film has already or previously been deposited prior to a treatment with a protective treatment. And shorter periods, such as about 2-3 seconds or less, may be desired when incorporating a treatment step into a deposition cycle, such as in the formation of a metal carbide or metal nitride layer. The duration of a treatment step may also depend on the reactor conditions. For example, where a reaction chamber tends to not hold pressure over time, it may be desirable to perform the treatment as a plurality of short pulses in order to maintain a relatively constant concentration within the reaction. However, in a reactor that can maintain pressure longer, longer single pulses or soaks may be desirable.

Metal Carbide Films

According to some embodiments, an ALD type process is used to form metal thin films on a substrate. For example, metal carbide thin films, such as titanium carbide can be deposited on an integrated circuit workpieces. Other suitable metal carbide thin films include, but are not limited to, TaC, HfC, TaAlC, SiC, etc. The ALD process may comprise at least one deposition cycle in which a treatment agent comprising silane and or borane is provided. The surfaces on which the thin titanium carbide (TiC) films are deposited can take a variety of forms. Examples include, but are not limited to silicon, silicon oxide ($SiO_2$), coated silicon, dielectric materials, low-k materials, metals—such as copper and aluminum—metal alloys, metal oxides and various nitrides, such as transition metal nitrides and silicon nitride or a combination of said materials.

In a some embodiments, a substrate or workpiece is placed in a reaction chamber and subjected to alternately repeated surface reactions. In particular, thin films are formed by repetition of an ALD cycle. Each ALD cycle is typically self-limiting. In the case of compound metallic thin film deposition, at least two different source chemicals are alternatively employed. One reactant will form no more than about one monolayer on the substrate surface and includes a metal species desired in the layer being deposited. This reactant, also referred to herein as "the metal reactant," is preferably a titanium halide, and thus the deposited monolayer is terminated with halogen ligands.

A second reactant preferably contributes carbon. In some embodiments, the second reactant comprises a metal and carbon, such as trimethylaluminum (TMA) or triethylaluminum (TEA). In some embodiments, the second reactant is a metal-containing source chemical comprising at least one ligand, such as a metalorganic compound. Further, in some embodiments the second reactant can also leave some amount of metal in the film being deposited. For example, in the case of TMA or TEA, some amount of aluminum may be left in the film, depending on the particular reaction conditions.

In some embodiments according to the present disclosure, a third reactant that is the protective treatment agent is provided every cycle, after a certain number of cycles, or after deposition of the metal carbide film is complete. The third reactant may comprise a silicon compound, such as a silane, or a boron compound, such as a borane. The protective treatment agent is preferably more reactive to oxygen than is titanium and thus is capable of reducing the amount of titanium oxide in the film. In some cases, little or no oxygen is actually removed from the thin film; however, the protective treatment acts to reduce titanium oxide by breaking the bonds between titanium and oxygen to return the titanium to its pure titanium carbide form. In such cases, although, the oxygen has not actually been removed from the film, it is bound up by the protective treatment so as to not impede the workfunction of the thin film. Accordingly, it could also be said that application of a protective treatment increases the amount of TiC compared to the amount of TiOC in the film. Moreover, in some embodiments the third reactant also provides a species desired in the thin film, such as silicon or boron.

The protective treatment agent may be selected from the group consisting of monosilane, disilane, trisilane, borane, diborane, triborane, or any other suitable material that readily reacts with oxygen to reduce titanium. The protective treatment may be supplied in vapor or liquid form, and may be applied as a relatively short pulse every cycle or intermittently in the deposition process or as a relatively longer soak to a partially or completely formed titanium carbide layer.

The protective treatment may be provided before one or more ALD cycles, in each ALD cycle, at intervals during the deposition process, or after the deposition process has been completed. For example, in some embodiments the protective treatment is provided every one to four ALD cycles. In some embodiments, at the time the protective treatment is provided, the film grown in the most recent ALD cycles is preferably thin enough that the protective treatment can penetrate the film. In some embodiments, such as situations where more than one deposition cycle has been completed prior to exposure to the protective treatment, the amount of silane/borane penetration in the films can be controlled by the quantity or concentration of the agent used or the duration of the exposure.

The protective treatment may be provided as a part of one or more cycles or may be applied after one or more cycles have been completed. Thus, in some embodiments, the deposition of a metal carbide film, such as TiC, is considered to be a cycle in an ALD process independent of the application of a protective treatment. In such cases, the cycle is repeated as many times as desired, and the silane/borane treatment is applied after some or all of the cycles. However, in some embodiments, the protective treatment is applied during one or more cycles (as a part of an ALD cycle) as well as after one or more cycles (separate from an ALD cycle).

In one phase of an ALD cycle ("the titanium phase" or the "first phase"), the reactant or source chemical comprising titanium is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the titanium reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant byproducts (if any) are removed from the reaction space, for example by purging with an inert gas and/or evacuation.

In the next phase of the cycle, a pulse of a second source chemical is provided that reacts with the molecules left on the substrate surface by the preceding pulse. In some embodiments the source chemical preferably comprises carbon that is to be incorporated in the thin film. The carbon is incorporated into the thin film by the interaction of the source chemical with the monolayer left by the metal reactant. This phase is referred to herein as "the second phase" or the "carbon-contributing phase." In some embodiments, the second source chemical is a carbon containing compound and its reaction with the chemisorbed metal species produces a metal carbide layer on the substrate. In some embodiments the second source chemical also comprises a second metal, such as aluminum, and the second metal is incorporated into the growing film along with the carbon. In some embodiments the species-contributing source chemical comprises metal and carbon and may be, for example, TTBA, TMA, or TEA. The second source chemical may or may not be self-limiting when deposited on the substrate.

Excess second source chemical and reaction byproducts, if any, are removed from the reaction space by purging and/or evacuation.

In some embodiments, a third phase of the ALD cycle comprises providing the protective treatment. In the some embodiments the protective treatment removes oxygen from the growing thin film and/or reacts with oxygen preferentially relative to the other metals in the growing film. In some embodiments, the protective treatment may also remove or isolate other contaminants. In addition, the protective treatment may comprise a species that may be incorporated into the thin film, such as boron or silicon. This is referred to as the "third phase" or the "oxygen isolation phase."

Although referred to as the "first phase," the "second phase" and the "third phase," these labels are for convenience and do not indicate the actual order of the phases in each ALD cycle. Thus, the initial ALD cycle may be started with any of the three phases described above. However, one of skill in the art will recognize that if the initial ALD cycle does not begin with the metal reactant phase, at least two ALD cycles will typically need to be completed to deposit about a monolayer of the desired metal carbide thin film.

In addition, the order of the phases may be changed. That is, in some embodiments the protective treatment may be the next reactant provided after the second reactant, while in other embodiments the protective treatment may be the next reactant provided after the first metal source reactant. And in some embodiments, the protective treatment may be supplied after only some cycles or after all cycles have been completed. For example, in some embodiments the third phase (provision of the protective treatment) may immediately follow the first phase (provision of the reactant comprising a metal species), which in turn is followed by the carbon-contributing phase. And in some embodiments, the third phase may be supplied as a "soak," liquid or vapor, after the thin film has been completely formed. That is, the deposited film is exposed to a silane or a borane in liquid or vapor form for a period of time. A phase is generally considered to immediately follow another phase if only a purge or other reactant removal step intervenes.

In some embodiments the protective treatment is not provided in every ALD cycle. Rather, a partially or completely deposited titanium carbide film may be treated with a protective treatment agent. This may the case, for example, where a first film has been formed using $TiCl_4$ and TEA but the resulting TiAlC film has been oxidized by water, air, or some other contaminant source to form a layer that is essentially TiAlOC. A protective treatment can be applied to the first film to reduce the TiAlOC layer back to essentially TiAlC with only the minor presence of impurities.

In one embodiment, an ALD cycle comprises:
1. providing a titanium halide to the reaction space;
2. substantial purging and/or evacuation of excess titanium halide and reaction byproducts;
3. providing a carbon-contributing reactant to the reaction space, such TEA or TMA;
4. substantially purging and/or evacuation of excess second reactant and reaction byproducts; and
5. providing a protective treatment to the reaction space.

Step 5 can be included in each ALD cycle, or steps 1-4 can be repeated several times before step 5 is introduced. In some embodiments steps 1-4 are repeated up to 10 times before step 5 is included. In other embodiments steps 1-4 are repeated up to 100 or even 1000 or more times before step 5 is included. In some embodiments, a complete film of desired thickness is deposited prior to step 5.

Figure 5:
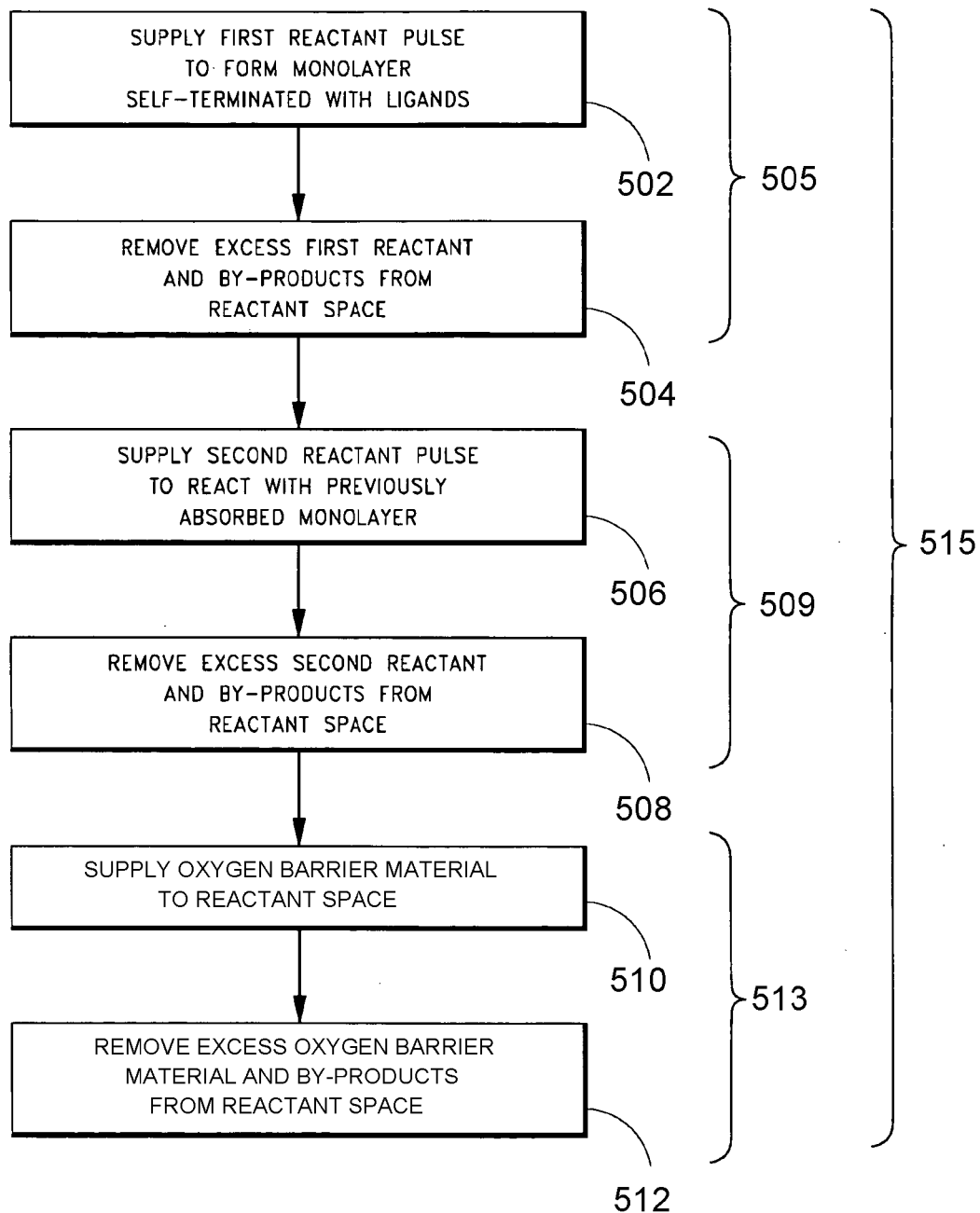
FIG. 5 is a flow chart illustrating methods of forming a thin film by ALD, in which supply of a protective treatment follows removal of excess second reactant and by-products, in accordance with some embodiments.

With reference to FIG. 5, in an embodiment of the invention, after initial surface termination, if necessary, a first reactant or source chemical pulse is supplied 502 to the substrate or workpiece. In the illustrated embodiment, the first reactant is a metal halide, and the thin film being formed comprises a metal carbide. In accordance with a preferred embodiment, the first reactant pulse comprises a carrier gas flow and a volatile titanium halide species that is reactive with the workpiece surfaces of interest. Accordingly, the halogen-containing titanium species adsorbs upon the workpiece surfaces. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first reactant is then removed 504 from the reaction space. Step 504 may entail merely stopping the flow of the first reactant or chemistry while continuing to flow a carrier gas for a sufficient time to diffuse or purge excess reactants and reactant by-products from the reaction space. Preferably the removal 504 comprises continuing to flow purge gas for between about 0.1 seconds and 20 seconds after stopping the flow of the first reactant pulse. Inter-pulse purging is described in co-pending U.S. Pat. No. 6,511,539, entitled "IMPROVED APPARATUS AND METHOD FOR GROWTH OF A THIN FILM," the disclosure of which is incorporated herein by reference. In other arrangements, the chamber may be pumped down between alternating chemistries. See, for example, PCT publication number WO 96/17107, published Jun. 6, 1996, entitled "METHOD AND APPARATUS FOR GROWING THIN FILMS," the disclosure of which is incorporated herein by reference. Together, the adsorption 502 and reactant removal 504 represent a first phase 505 in an ALD cycle. The first phase in the illustrated ALD cycle is thus the metal phase.

With continued reference to FIG. 5, a second reactant or source chemical pulse is then supplied 506 to the workpiece. The second chemical reacts with the monolayer left by the first reactant. In the illustrated embodiment, this second reactant pulse 506 comprises supplying a carrier gas with the second source gas to the workpiece. In particular, where the first reactant comprises a titanium halide, the second reactant, such as TMA or TEA, comprises carbon and a second, different metal. In the case of TEA or TMA the second reactant leaves no more than about a monolayer of TiCAl. The second reactant preferably removes at least some halide ligands from the adsorbed first reactant. The second reactant pulse 506 also leaves a surface termination that operates to limit the deposition in a saturative reaction phase.

After a time period sufficient to completely saturate and react the monolayer with the second reactant pulse 506, any excess second reactant is removed 508 from the workpiece. As with the removal 504 of the first reactant, this step 508 may comprise stopping the flow of the second chemistry and continuing to flow carrier gas for a time period sufficient for excess reactants and volatile reaction by-products from the second reactant pulse to diffuse out of and be purged from the reaction space. Together, the second reactant pulse 506 and removal 508 represent a second phase 509 in the illustrated process, and can also be considered a carbon and metal species-contributing phase.

When the excess reactants of the second reactant pulse have been removed 508 from the chamber, a third reactant or source chemical pulse may be supplied to the workpiece 510. The third reactant can be a protective treatment agent or oxygen barrier material capable of removing halides and/or reacting with oxygen in the growing film. Examples of suitable agents include silanes and boranes, including monosilane, disilane, trisilane, borane, and diborane. The oxygen barrier material or protective treatment may be provided with an inert carrier gas. Temperature and pressure conditions can be adjusted to control the level of diffusion of the protective treatment through the monolayer.

After a time period sufficient to achieve a desired level of saturation of the third reactant in the monolayer, excess unreacted oxygen barrier material and any reaction by-products (which may also be volatile) are removed 512 from the reaction space, for example by a purge gas pulse. The removal can be as described for step 204. Together, the protective treatment pulse 510 and removal 512 represent a third phase 513 of the illustrated ALD process, which can also be referred to as the oxygen isolation phase.

The combination of first phase 505, second phase 509, and third phase 513, can be considered as a single deposition cycle 515. In some embodiments, the ordering of the third phase 513 actually precedes either or both the first phase 505 and the second phase 509. In some embodiments, the third phase 513 is included in only some or only one deposition cycle 515.

In some embodiments, supplying a protective treatment immediately follows the step of removing excess first reactant and by-products. After a time period sufficient to react the monolayer with the protective treatment, excess unreacted protective treatment materials and reaction by-products are removed from the reaction space, possibly by a purge gas pulse. The removal step is followed by supply of the second reactant pulse.

In some embodiments of the disclosure (not shown), the steps of supplying the protective treatment and removing any excess protective treatment materials and by-products precede the step of supplying the first reactant. In some embodiments, the protective treatment is not provided in every cycle or may be provided after all the cycles are complete.

In some embodiments, the step of supplying a protective treatment takes the form of a soak occurring after some or all of the titanium carbide deposition cycles have been completed. In some cases, a soak of trisilane occurring after deposition of a TiC film is completed has been found to achieve suitable results.

In one embodiment, a process for forming a titanium carbide film comprises:
1. providing a titanium halide, such as a titanium chloride, to the reaction space;
2. substantially purging and/or evacuation of excess titanium halide and reaction byproducts;
3. providing a second carbon and aluminum-contributing reactant, such as TEA or TMA, to the reaction space;
4. substantially purging and/or evacuation of excess second reactant and reaction byproducts;
5. repeating steps 1 through 4 for either a desired number of cycles or until a film of a desired thickness has been achieved; and
6. subjecting the product of step 5 to a soak with a protective treatment agent.

The soak of Step 6 can be configured to achieve a particular level of interaction between any oxygen present in the film and the protective treatment. For example, the soak may last long enough to substantially diffuse throughout the film or the soak's duration may be kept shorter so as to reach only a partial depth in the film. In some embodiments, a soak may serve to "coat" a thin film with an oxygen barrier by providing silicon or boron in the film. In some embodiments, the protective treatment is applied as a soak is trisilane.

The foregoing embodiments will be discussed in the context of specific thin film chemistries.

Carbon containing metal films or metal carbides have varying applications, such as gate electrodes, electrodes in capacitors and barrier layers in damascene and dual damascene structures.

In some embodiments, a general pulsing sequence for carbon-containing metal or metal carbide thin film deposition is:

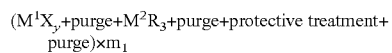

or

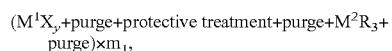

wherein $m_1$ is the number of total cycles.

$M^1$ is a metal atom, preferably selected from the group consisting of Ti, Zr, Hf, V, Nb, Ta, Cr, Mo, W. And in some embodiments $M^1$ is selected from the group consisting of Fe, Mn, Ni, Co, Cu, Zn, Cd, Ge, Si, Sn, Sb, Ga, Ru, Ir, Pd, Pt, Au, Rh, Re, B, In and Al.

$M^2$ is a metal atom, preferably selected from the group consisting of B, Al, In, Sn, Bi, Sn, Zn, Pb, Sb and Ga. R is a ligand for $M^2$ and can be any ligand, preferably a metalorganic ligand, more preferably an organometallic ligand, most preferably an alkane ligand, such as ethyl ligand.

$X_y$ is one or more ligands for $M^1$. Each X may be a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments.

The protective treatment may comprise exposure to a treatment agent selected from the group consisting of monosilane, disilane, trisilane, borane, diborane, triborane, etc. In some embodiments, the protective treatment is a disilane or a trisilane that is applied during or after each layer is deposited, before any layers are deposited, after only some layers are deposited, or after all the layers have been deposited. The protective treatment can be applied in a pulse or as a soak and as a liquid or as a vapor.

In preferred embodiments, $M^2$ is a metal, preferably aluminum, and R is a carbon-containing ligand. $M^2R_3$ preferably has at least one metal-to-carbon bond. In some embodiments, $M^2R_3$ may be considered a carbon source chemical. In some embodiments, $M^2R_3$ is selected from the group consisting of TMA and TEA.

One benefit of the ALD processes of some embodiments is that the growth rate is extremely high for an ALD process or a quasi-ALD process. For example, the growth rate for TaC formation can be over 2 Å/cycle. Further, annealing can be performed after the metal carbide deposition for enhancing the properties of the film. Suitable atmospheres, such as $N_2$ or forming gas ($N_2/H_2$), may be used during annealing.

Exemplary pulsing sequences for TiC film formation include:

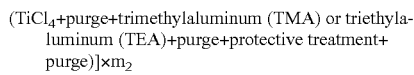

and

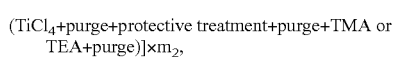

wherein $m_2$ is the number of total cycles and the protective treatment is selected from the group consisting of monosilane, disilane, trisilane, borane, diborane, triborane, etc.

Films deposited using the above exemplary pulsing sequence contained, based on an atomic basis, about 17-20% Ti, about 17-27% Al, about 16-42% Si, and about 21-39% C. In some films, Al may be as much as about 40% on an atomic basis. These values were determined using Rutherford backscattering spectrometry, or RBS.

In other embodiments, a protective treatment is not utilized every cycle but only in some of the cycles. In this situation, a general pulsing sequence for carbon-containing metal thin film deposition can be:

$$[n_3 \times (M^1X_y + \text{purge} + M^2R_3 + \text{purge}) + m_3 \times (\text{protective treatment} + \text{purge})] \times k_3,$$

wherein $n_3$ is the number of carbide cycles in one total cycle, $m_3$ is the number of cycles in which a protective treatment is used in one total cycle, and $k_3$ is the number of total cycles.

$M^1$ is preferably Ti but may be a metal atom selected from the group consisting of Zr, Hf, V, Nb, Ta, Cr, Mo, W, Si and Al. In other embodiments $M^1$ can be selected from the group consisting of Fe, Mn, Ni, Co, Cu, Zn, Cd, Ge, Si, Sn, Sb, Ga, Ru, Ir, Pd, Pt, Au, Rh, Re, B, In. $M^2$ is preferably Al but may be a metal atom selected from the group consisting of B, Al, In, Sn, Bi, Zn, Pb, Sb and Ga. R is a ligand for $M^2$ and can be any ligand.

$X_y$ is one or more ligands for $M^1$. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments.

Use of a protective treatment as disclosed herein has the potential of providing a thin film, such as a TiC, with resistance to oxidation during subsequent processing. Without being tied to any particular theory, it is believe that resistance to oxidation is increased in part because the protective treatment tends to decrease the amount of carbon in the thin film as it is partially replaced by silicon or boron or some other element comprising the protective treatment.

Metal Nitride Films

According to some embodiments, an ALD or quasi-ALD process is used to form titanium nitride thin films on substrates, such as integrated circuit workpieces. The surfaces on which the thin titanium nitride (TiN) films are deposited can take a variety of forms. Examples include, but are not limited to, hafnium oxide, silicon, silicon oxide ($SiO_2$), coated silicon, dielectric materials, low-k materials, metals—such as copper and aluminum—metal alloys, metal oxides and various nitrides, such as transition metal nitrides and silicon nitride or a combination of said materials.

In a some embodiments, a substrate or workpiece is placed in a reaction chamber and subjected to alternately repeated surface reactions. In particular, thin films are formed by repetition of an ALD cycle. Each ALD cycle is typically self-limiting, though, as discussed above, the reaction conditions may be modified to achieve a quasi-ALD process, such as where a true ALD process would require an undesirable amount of time to perform. In the case of compound metallic thin film deposition, at least two different source chemicals are alternatively employed. One reactant may form no more than about one monolayer on the substrate surface and includes a metal species desired in the layer being deposited. This reactant, also referred to herein as "the metal reactant," is preferably a titanium halide, and thus the deposited layer is terminated with halogen ligands.

A second reactant preferably contributes nitrogen. In some embodiments, the second reactant comprises $NH_3$, hydrazine, or radicals/ions of N and H (for example in a PEALD process) or other known nitrogen compound for use in ALD.

In some embodiments according to the present disclosure, a third reactant is provided every cycle, after a certain number of cycles, or after deposition of the TiN film is complete. The third reactant may be a protective treatment agent, and may comprise a silicon compound or a boron compound, preferably one that can reduce at least a portion of any oxidized TiN. In other words, the protective treatment may act to reduce titanium-oxygen bonds to restore the titanium-nitride bonds. In some embodiments the third reactant comprises a silane or a borane, such as monosilane, disilane, trisilane, borane, diborane, triborane, etc.

The protective treatment is more reactive to oxygen than is titanium and thus is capable of reducing the amount of titanium oxide in the film. In some cases, little or no oxygen is actually removed from the thin film; however, the protective treatment acts to reduce titanium oxide by breaking the bonds between titanium and oxygen to return the titanium to its pure titanium carbide form. In such cases, although, the oxygen has not actually been removed from the film, it is bound up by the protective treatment so as to not impede the workfunction of the TiN film or a film deposited prior or subsequent to the TiN film. Accordingly, it could also be said that application of a protective treatment increases the amount of TiN compared to the amount of TiON in the film. Moreover, in some embodiments the third reactant also provides a species desired in the thin film, such as silicon or boron.

The protective treatment may be provided in each ALD cycle, at intervals during the deposition process, or after the deposition process has been completed. For example, in some embodiments the protective treatment is provided every one to four ALD cycles. In some embodiments, at the time the protective treatment is provided, the film grown in the most recent ALD cycle is preferably thin enough that the protective treatment can penetrate the film. In some embodiments, such as situations where more than one deposition cycle have been completed prior to exposure to the protective treatment, the amount of penetration or diffusion in the films can be controlled any number of factors, such as duration, temperature, pressure, selection of the protective treatment, quantity or concentration of the barrier material used, etc.

The protective treatment may be provided as a part of one or more cycles or may be applied after one or more cycles have been completed. Thus, in some embodiments, the deposition of a metal nitride film, such as TiN, is considered to be a cycle in an ALD process independent of the application of a protective treatment. In such cases, the cycle is repeated as many times as desired, and the treatment using a protective treatment is applied after some or all of the cycles. However, in some embodiments, the protective treatment is applied during one or more cycles (as a part of an ALD cycle) as well as after one or more cycles (separate from an ALD cycle).

In one phase of an ALD cycle ("the titanium phase" or the "first phase"), the reactant or source chemical comprising titanium is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the titanium reactant is ideally self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant byproducts (if any) are removed from the reaction space, for example by purging with an inert gas and/or evacuation.

However, in some embodiments, the purge step may be insufficiently long to fully clear the reaction space of precursors before the next precursor is pulsed through the reaction space. In some cases, full evacuation or purging may require a period of time that is not economical or efficient. Moreover, some precursors may actually decompose or partially decompose within the reaction space.

In the next phase of the cycle, a pulse of a second source chemical is provided that reacts with the molecules left on the substrate surface by the preceding pulse. In some embodiments the source chemical preferably comprises nitrogen that is to be incorporated in the thin film. The nitrogen is incorporated into the thin film by the interaction of the source chemical with the monolayer left by the metal reactant. This phase is referred to herein as "the second phase" or the "nitrogen-contributing phase." In some embodiments, the second source chemical is a nitrogen-containing compound and its reaction with the chemisorbed metal species produces a metal nitride layer on the substrate.

Excess second source chemical and reaction byproducts, if any, are removed from the reaction space by purging and/or evacuation.

In some embodiments, a third phase of the ALD cycle comprises providing the protective treatment agent. In the some embodiments the protective treatment agent removes or isolates oxygen from the growing thin film and/or reacts with oxygen preferentially relative to the other metals in the growing film. In addition, the protective treatment agent may comprise a species that may be incorporated into the thin film, such as boron or silicon. This is referred to as the "third phase" or the "oxygen isolation phase."

Although referred to as the "first phase," the "second phase" and the "third phase," these labels are for convenience and do not indicate the actual order of the phases in each ALD cycle. Thus, the initial ALD cycle may be started with any of the three phases described above. However, one of skill in the art will recognize that if the initial ALD cycle does not begin with the metal reactant phase, at least two ALD cycles will typically need to be completed to deposit about a monolayer of the desired metal nitride thin film.

In addition, the order of the phases may be changed. That is, in some embodiments the protective treatment may be the next reactant provided after the second reactant, while in other embodiments the protective treatment may be the next reactant provided after the first metal source reactant. In some embodiments, the protective treatment is supplied before any other reactants and may be supplied only initially as compared to as a part of cycle or after all the cycles are completed. And in some embodiments, the protective treatment may be supplied after only some cycles or after all cycles have been completed. For example, in some embodiments the third phase (provision of the protective treatment) may immediately follow the first phase (provision of the reactant comprising a metal species), which in turn is followed by the nitrogen-contributing phase. And in some embodiments, the third phase may be supplied as a "soak," after the thin film has been completely formed. That is, the deposited film is exposed to a silane or a borane for a more extended period of time. A phase is generally considered to immediately follow another phase if only a purge or other reactant removal step intervenes.

In some embodiments the protective treatment agent is not provided in every ALD cycle. Rather, a partially or completely deposited titanium nitride film may be treated with a protective treatment. This may be the case, for example, where a first TiN film has been formed by has been or is likely to be oxidized by water, air, or some other contaminant source to form a layer that is essentially TiON. A protective treatment can be applied to the first film to reduce the TiON layer back to essentially TiN with only the minor presence of impurities, such as oxygen, or to prevent oxidation of the Ti in the layer.

In one embodiment, an ALD cycle comprises:
1. providing a titanium halide to the reaction space;
2. substantially purging and/or evacuation of excess titanium halide and reaction byproducts;
3. providing a nitrogen-contributing reactant to the reaction space, such as $NH_3$;
4. substantially purging and/or evacuation of excess second reactant and reaction byproducts; and
5. providing a protective treatment to the reaction space.

Step 5 can be included in each ALD cycle, or steps 1-4 can be repeated several times before step 5 is introduced. In some embodiments steps 1-4 are repeated up to 10 times before step 5 is included. In other embodiments steps 1-4 are repeated up to 100 or even 1000 or more times before step 5 is included. In some embodiments, a complete film of desired thickness is deposited prior to step 5.

With reference again to FIG. 5, in an embodiment of the invention, after initial surface termination, if necessary, a first reactant or source chemical pulse is supplied 502 to the substrate or workpiece. In the illustrated embodiment, the first reactant is a metal halide, and the thin film being formed comprises a metal nitride. In accordance with a preferred embodiment, the first reactant pulse comprises a carrier gas flow and a volatile titanium halide species that is reactive with the workpiece surfaces of interest. Accordingly, the halogen-containing titanium species adsorbs upon the workpiece surfaces. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first reactant is then removed 304 from the reaction space. Step 504 may entail merely stopping the flow of the first reactant or chemistry while continuing to flow a carrier gas for a sufficient time to diffuse or purge excess reactants and reactant by-products from the reaction space. Preferably the removal 504 comprises continuing to flow purge gas for between about 0.1 seconds and 20 seconds after stopping the flow of the first reactant pulse. Together, the adsorption 502 and reactant removal 504 represent a first phase 505 in an ALD cycle. The first phase in the illustrated ALD cycle is thus the metal phase.

With continued reference to FIG. 5, a second reactant or source chemical pulse is then supplied 506 to the workpiece. The second chemical reacts with the monolayer left by the first reactant. In the illustrated embodiment, this second reactant pulse 506 comprises supplying a carrier gas with the second source gas to the workpiece. In particular, where the first reactant comprises a titanium halide, the second reactant, may be a nitrogen compound such as $NH_3$. The second reactant preferably removes at least some halide ligands from the adsorbed first reactant leaving no more than about a monolayer of TiN. The second reactant pulse 506 also leaves a surface termination that operates to limit the deposition in a saturative reaction phase.

After a time period sufficient to completely saturate and react the monolayer with the second reactant pulse 506, any excess second reactant is removed 308 from the workpiece. As with the removal 504 of the first reactant, this step 508 may comprise stopping the flow of the second chemistry and continuing to flow carrier gas for a time period sufficient for excess reactants and volatile reaction by-products from the second reactant pulse to diffuse out of and be purged from the reaction space. Together, the second reactant pulse 506 and removal 508 represent a second phase 509 in the illustrated process, and can also be considered a nitrogen-contributing phase.

According to some embodiments, a residual amount of a metal, such as aluminum, is present in the chamber during the nitrogen-contributing phase. The metal may have been used in a previous phase. Because it is present during the nitrogen-contributing phase, it is possible for it to be incorporated into the resulting metal nitride layer. For example, the deposition of a TiN layer may actually produce at least some TiAlN.

When the excess reactants of the second reactant pulse have been removed 508 from the chamber, a third reactant pulse may be supplied to the workpiece 510. The third reactant can be a protective treatment agent capable of removing halides and/or reacting with oxygen in the growing film. Examples of suitable protective treatment agents include silanes and boranes, for example in the form of monosilane, disilane, trisilane, borane, diborane, triborane, etc. The protective treatment agent may be provided with an inert carrier gas. Temperature and pressure conditions can be adjusted to control the level of diffusion of the protective treatment agent through the monolayer.

After a time period sufficient to achieve a desired level of saturation of the third reactant in the monolayer, excess unreacted protective treatment agent and any reaction by-products (which may also be volatile) are removed 512 from the reaction space, for example by a purge gas pulse. The removal can be as described for steps 504 or 508. Together, the protective treatment pulse 510 and removal 512 represent a third phase 513 of the illustrated ALD process, which can also be referred to as the oxygen isolation phase.

The combination of first phase 305, second phase 509, and third phase 513, can be considered as a single deposition cycle 515. In some embodiments, the ordering of the third phase 513 actually precedes either or both the first phase 505 and the second phase 509. In some embodiments, the third phase 513 is included in only some or only one deposition cycle 515.

In some embodiments, supply of a protective treatment agent immediately follows the step of removing excess first reactant and by-products. After a time period sufficient to react the monolayer with the protective treatment agent, excess unreacted protective treatment materials and reaction by-products are removed from the reaction space, possibly by a purge gas pulse. The removal step is followed by supply of the second reactant pulse.

In some embodiments of the disclosure (not illustrated), the steps of supplying the protective treatment and removing any excess protective treatment materials and by-products precede the step of supplying the first reactant. In some embodiments, the protective treatment is not provided in every cycle or may be provided after all the cycles are complete.

In some embodiments, the step of supplying a protective treatment agent takes the form of a soak occurring after some or all of the titanium nitride deposition cycles have been completed. In some cases, a soak of trisilane occurring after deposition of a TiN film is completed has been found to achieve suitable results.

In one embodiment, a process for forming a titanium nitride film comprises:
1. providing a titanium halide, such as a titanium chloride, to the reaction space;
2. substantial purging and/or evacuation of excess titanium halide and reaction byproducts;
3. providing a second reactant or a nitrogen-contributing reactant, such as $NH_3$, hydrazine, or radicals/ions of N and H (used in a PEALD process), to the reaction space;
4. substantially purging and/or evacuation of excess second reactant and reaction byproducts;
5. repeating steps 1 through 4 at least once or for either a desired number of cycles or until a film of a desired thickness has been achieved; and
6. subjecting the product of step 5 to a soak with a protective treatment agent comprising silane and/or borane.

The soak of Step 6 can be configured to achieve a particular level of interaction between any oxygen present in the film and the protective treatment agent. For example, the soak may last long enough to substantially diffuse throughout the film or the soak's duration may be kept shorter so as to reach only a partial depth in the film. In some embodiments, a soak may serve to "coat" a thin film with an oxygen barrier by providing silicon or boron in the film. In some embodiments, the protective treatment applied as a soak is trisilane.

According to some embodiments, it may be desirable to subject a thin film, such as metal nitride, to a protective treatment well after the film has been deposited but before proceeding with a subsequent deposition process whether or not the subsequent process itself includes an oxygen barrier treatment.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A method of reducing oxidation at an interface between two different metal-containing thin films comprising:
providing a substrate comprising a first metal-containing thin film;
contacting the first metal-containing thin film with a silane compound or a borane compound;
after contacting the substrate with the silane compound or borane compound, depositing a second metal-containing thin film over the first thin film.

2. The method of claim 1, wherein the first metal-containing thin film is directly over a dielectric material.

3. The method of claim 1, wherein the first metal-containing thin film comprises a metal selected from Ti, Ta, Hf, V, Nb, and Zr.

4. The method of claim 1, wherein the first metal-containing thin film is an etch stop layer or barrier layer and the second metal-containing thin film is a workfunction setting layer.

5. The method of claim 1, wherein the first metal-containing thin film is a TiN, TiAlN, TaN or TiAlCN thin film.

6. The method of claim 1, wherein the second metal containing thin film comprises an n-type metal.

7. The method of claim 1, wherein the second metal containing thin film comprises TiAl, TaC, HfC, TaAlC, TiAlSiC, TiAlB, TaAlB, TiAlSiB, TaAl, SiAlSiC or HfAlSiB.

8. The method of claim 1, wherein the second metal-containing thin film is a titanium carbide film.

9. The method of claim 1, wherein contacting the first metal-containing thin film with a silane compound or borane compound comprises exposing the first metal-containing thin film to the silane compound or borane compound for a duration of between about 1 second and about 2 minutes.

10. The method of claim 1, additionally comprising contacting the second metal-containing thin film with a silane or borane compound.

11. The method of claim 1 wherein depositing the second metal-containing thin film comprises an atomic layer deposition process comprising multiple deposition cycles.

12. The method of claim 10, wherein the substrate is exposed to a silane or borane compound in each deposition cycle.

13. The method of claim 1, additionally comprising depositing a third metal-containing thin film over the second metal-containing thin film.

14. The method of claim 12, wherein the substrate is contacted with a silane or borane compound during or after depositing the second metal-containing thin film and prior to depositing the third metal-containing thin film.

15. The method of claim 12, wherein the substrate is contacted with a silane or borane compound during or after deposition of the third metal-containing thin film.

16. The method of claim 14, additionally comprising depositing a metal thin film over the third metal-containing thin film.

17. The method of claim 15, wherein the metal thin film is a tungsten thin film.

18. The deposition method of claim 1, wherein the silane or borane is selected from the group consisting of monosilane, disilane, trisilane, borane, diborane, and triborane.

19. The deposition method of claim 17, wherein the silane or borane is trisilane.

20. The deposition method of claim 1, wherein the first and second metal-containing thin films are deposited in situ.

21. A method for depositing a metal layer over an etch stop layer, the method comprising, sequentially:
   providing a substrate comprising an etch stop layer;
   contacting the etch stop layer with a silane compound or a borane compound; and
   depositing a metal-containing layer over the first etch stop layer.

22. The method of claim 21, wherein the etch stop layer is a titanium nitride layer and the metal-containing layer comprises an n-type metal.

23. The method of claim 22, wherein the metal-containing layer comprises TiAl, TaC, HfC, TaAlC, TiAlSiC, TiAl B, TaAlB, TiAlSiB, TaAl, TiAlSiC TaAlSiB, or HfAlSiB.

24. The method of claim 21, further comprising contacting the metal-containing layer with a silane or borane compound.

25. The method of claim 21, wherein the metal-containing layer is deposited by an atomic layer deposition process comprising multiple deposition cycles, and wherein the substrate is contacted with a silane or borane compound during at least one of the deposition cycles.

26. The method of claim 25, wherein the silane or borane is selected from the group consisting of monosilane, disilane, trisilane, borane, diborane, and triborane.

27. The deposition method of claim 21, wherein contacting the etch stop layer with a silane compound or borane compound does not increase a thickness of a first metal nitride layer.

* * * * *

UNITED STATES PATENT AND TRADEMARK OFFICE
CERTIFICATE OF CORRECTION

PATENT NO. : 9,111,749 B2
APPLICATION NO. : 14/300986
DATED : August 18, 2015
INVENTOR(S) : Eric J. Shero et al.

It is certified that error appears in the above-identified patent and that said Letters Patent is hereby corrected as shown below:

ON THE TITLE PAGE

In column 1 (page 3, item 56) at line 67, Under Other Publications, change "NbC15" to --$NbCl_5$--.

In column 2 (page 3, item 56) at line 19, Under Other Publications, change "Zeitscrift" to --Zeitschrift--.

In column 2 (page 3, item 56) at line 40, Under Other Publications, change "depositied" to --deposited--.

In column 2 (page 3, item 56) at line 66, Under Other Publications, change "$Al_2O_3$" to --$Al_2O_3$--.

In column 1 (page 4, item 56) at line 22, Under Other Publications, change "Soloutions" to --Solutions--.

In column 1 (page 4, item 56) at line 28, Under Other Publications, change "$TiI_4$" to --$TiI_4$--.

In column 1 (page 4, item 56) at line 46, Under Other Publications, change "Plasm" to --Plasma--.

IN THE SPECIFICATION

In column 2 at line 55, Change "TiAl B," to --TiAlB,--.

In column 2 at line 56, Change "TiAlSiC TaAlSiB," to --TiAlSiC, TaAlSiB,--.

In column 12 at line 64, Change "and or" to --and/or--.

Signed and Sealed this
Twenty-second Day of March, 2016

Michelle K. Lee
*Director of the United States Patent and Trademark Office*

CERTIFICATE OF CORRECTION (continued)
U.S. Pat. No. 9,111,749 B2

IN THE CLAIMS

In column 26 at line 17, In Claim 23, change "TiAl B," to --TiAlB,--.

In column 26 at line 18, In Claim 23, change "TiAlSiC TaAlSiB," to --TiAlSiC, TaAlSiB,--.